US012607283B2

(12) United States Patent　　(10) Patent No.:　US 12,607,283 B2

Murakami　　(45) Date of Patent:　Apr. 21, 2026

(54) FLOW PATH STRUCTURE

(71) Applicant: NIDEC CORPORATION, Kyoto (JP)

(72) Inventor: Taku Murakami, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 0 days.

(21) Appl. No.: 19/027,880

(22) Filed: Jan. 17, 2025

(65) Prior Publication Data

US 2025/0237336 A1　　Jul. 24, 2025

(30) Foreign Application Priority Data

Jan. 19, 2024　(JP) ................................. 2024-006798

(51) Int. Cl.
F16L 33/207　　(2006.01)
F16B 2/08　　(2006.01)
H05K 7/20　　(2006.01)

(52) U.S. Cl.
CPC ...... F16L 33/2071 (2013.01); H05K 7/20272 (2013.01); F16B 2/08 (2013.01)

(58) Field of Classification Search
CPC ....... F16L 33/2071; F16L 33/03; F16L 33/24; F16L 33/30; F16L 33/08; H05K 7/20272; F16B 2/08
See application file for complete search history.

(56) References Cited

U.S. PATENT DOCUMENTS 2,688,498 A * 9/1954 Wilson
3,526,416 A * 9/1970 Kish ....................... F16L 33/08

| | | | | |
|---|---|---|---|---|
| 3,930,676 | A | * | 1/1976 | Adams |
| 4,489,464 | A | * | 12/1984 | Massari ................. F16L 33/03 |
| 4,819,307 | A | * | 4/1989 | Turner ................... F16L 33/08 |
| 5,410,781 | A | * | 5/1995 | Anjos ..................... F16L 33/08 |
| 5,601,317 | A | * | 2/1997 | Crouse ................... F16L 33/08 |
| 10,966,347 | B2 | * | 3/2021 | Wei ..................... H05K 7/20272 |
| 2007/0090643 | A1 | * | 4/2007 | Cheng .................... F16L 33/03 |
| 2010/0254758 | A1 | * | 10/2010 | Campbell ........... F16L 33/2071 |
| 2016/0083158 | A1 | * | 3/2016 | Wyatt .................... F16L 33/08 |
| 2018/0340557 | A1 | * | 11/2018 | Bowater ................. F16B 2/08 |
| 2022/0338384 | A1 | * | 10/2022 | Hogan .............. H05K 7/20272 |

FOREIGN PATENT DOCUMENTS

| CN | 112128492 A | 12/2020 |
|---|---|---|
| CN | 217272802 U | 8/2022 |
| TW | M286889 U | 2/2006 |

OTHER PUBLICATIONS

Official Communication issued in corresponding Taiwanese Patent Application No. 114101719, mailed on Oct. 7, 2025, 13 pages.

* cited by examiner

*Primary Examiner* — William S. Choi

(74) *Attorney, Agent, or Firm* — Keating & Bennett, LLP

(57) ABSTRACT

A flow path structure includes a flow path tube, a connection portion, and a clamp portion. The flow path tube includes a flow path tube space. The connection portion internally includes a connection portion space, and at least a portion of the connection portion is located in the flow path tube space. The clamp portion is located on an outer peripheral surface of the flow path tube. The thermal expansion coefficient of the flow path tube is different from that of the connection portion. The clamp portion includes a band portion surrounding the outer peripheral surface of the flow path tube at a position where the flow path tube and the connection portion overlap each other, and an acting portion that changes the size of an inner diameter of the band portion.

6 Claims, 6 Drawing Sheets

FLOW PATH STRUCTURE

CROSS-REFERENCE TO RELATED APPLICATIONS

The present application claims priority under 35 U.S.C. §119 to Japanese Patent Application No. 2024-006798, filed on Jan. 19, 2024, the entire contents of which are which incorporated herein by reference.

1. FIELD OF THE INVENTION

The present disclosure relates to flow path structures.

2. BACKGROUND

A pipe joint is known in which a binder is used to achieve a leakage preventing effect of a medium at a joint portion where a pipe is disposed in a tube. The binder includes a band portion surrounding the outer peripheral surface of the tube.

In a conventional pipe joint, a medium sometimes leaks from a flow path structure such as a joint portion. In particular, when the thermal expansion coefficient of the tube is different from the thermal expansion coefficient of the pipe, the medium sometimes leaks from the flow path structure.

SUMMARY

An example embodiment of a flow path structure according to the present disclosure is usable in a medium circulation device in which a medium circulates and includes a flow path tube, a connection portion, and a clamp portion. The flow path tube internally includes a flow path tube space through which the medium flows. The connection portion internally includes a connection portion space through which the medium flows, and at least a portion of the connection portion is located in the flow path tube space. The clamp portion is located on an outer peripheral surface of the flow path tube. The thermal expansion coefficient of the flow path tube is different from the thermal expansion coefficient of the connection portion. The clamp portion includes a band portion surrounding the outer peripheral surface of the flow path tube at a position where the flow path tube and the connection portion overlap each other in a radial direction, and an acting portion that changes the size of an inner diameter of the band portion in accordance with a change in size of at least one of an outer diameter of the flow path tube, an inner diameter of the flow path tube, and an outer diameter of the connection portion.

The above and other elements, features, steps, characteristics and advantages of the present disclosure will become more apparent from the following detailed description of the example embodiments with reference to the attached drawings.

DETAILED DESCRIPTION

Figure 1:
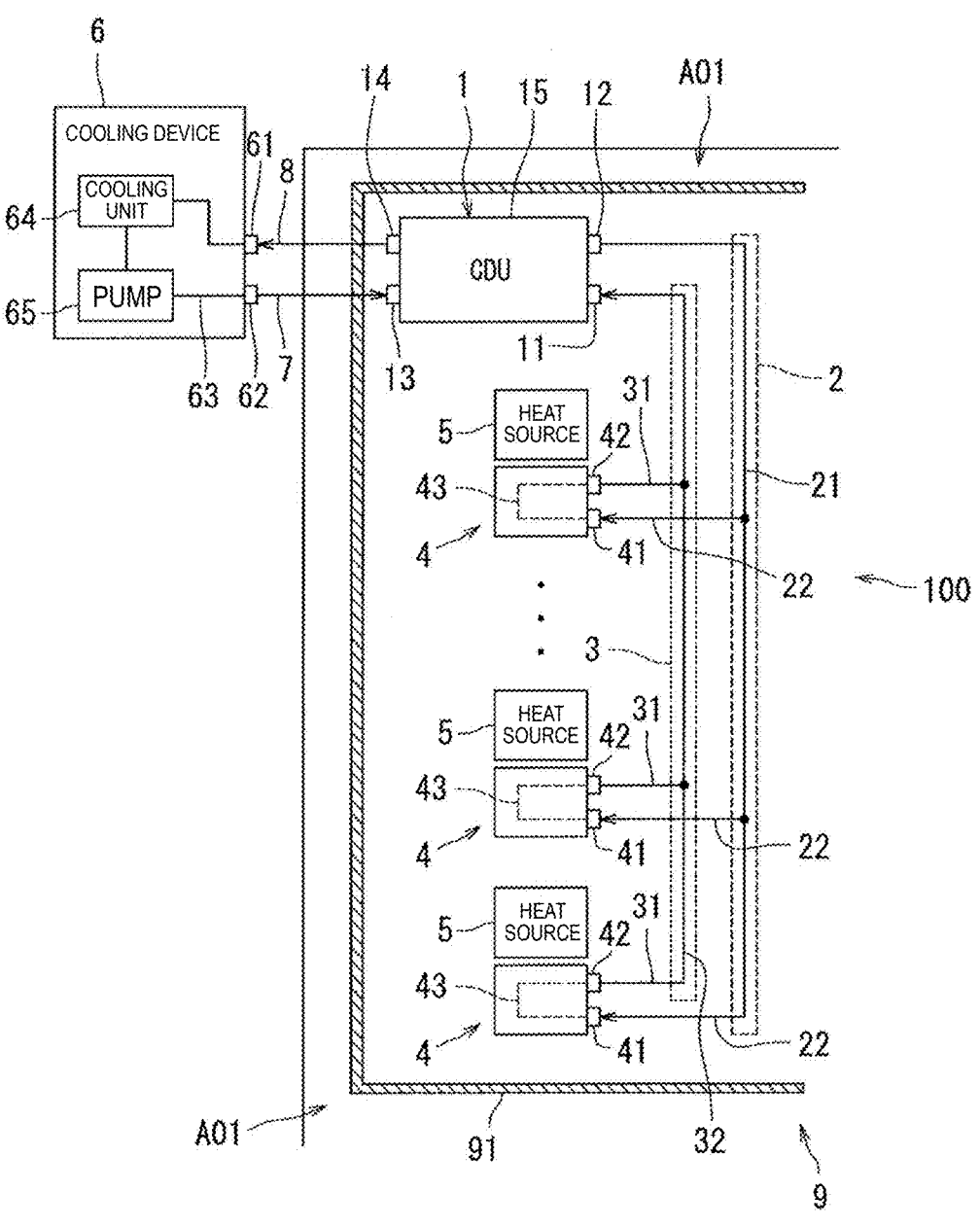
FIG. 1 is a diagram illustrating a configuration of a cooling system according to an example embodiment of the present disclosure.

Hereinafter, example embodiments of the present disclosure will be described with reference to the drawings. In the drawings, the same or corresponding structural elements, features, characteristics, etc., are denoted by the same reference numeral and description thereof will not be repeated.

In the drawings, an X axis, a Y axis, and a Z axis of a three-dimensional orthogonal coordinate system are appropriately described for easy understanding. In one example, the positive direction of the Z axis (Z direction) indicates an upward direction, and the negative direction of the Z axis indicates a downward direction. However, the up-down direction, an upward direction, and a downward direction are defined for convenience of description, and do not need to coincide with the vertical direction. The up-down direction is defined just for convenience of the description, and does not limit an orientation during use and assembly of the flow path structures of example embodiments of the present disclosure.

Furthermore, in the present specification, the positive direction of the X axis (X direction) indicates a direction away from the CDU, and is referred to as "one of front-back directions". In addition, the negative direction of the X axis indicates a direction approaching the CDU, and is referred to as "another of front-back directions". The "front-back direction" is an example of a "first directions". The "Y axis" is an example of a "second direction". The second directions and the first directions intersect with each other.

Figure 4:
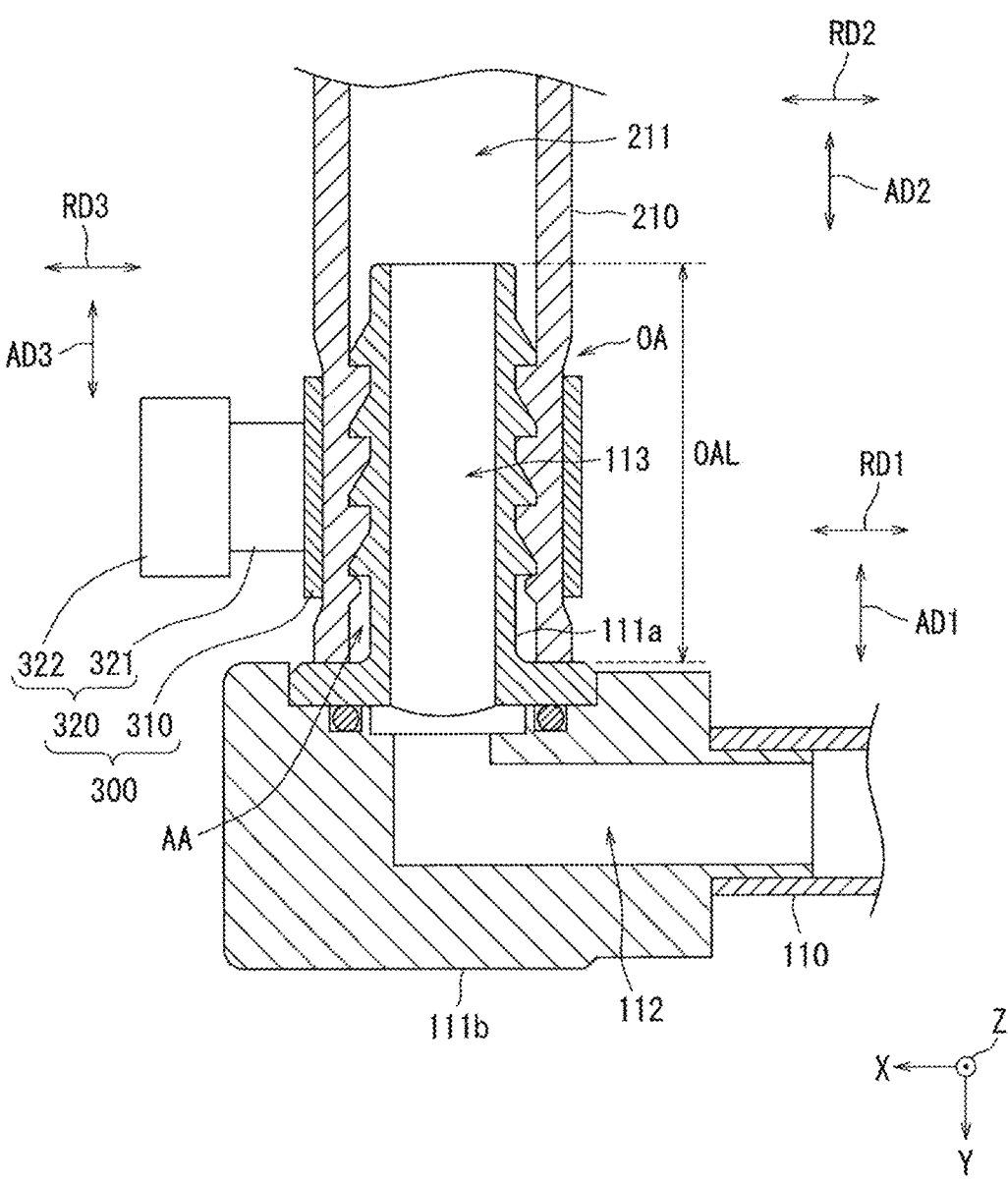
FIG. 4 is a cross-sectional view of a clamp portion and an inflow path tube according to an example embodiment of the present disclosure.

In the present description, a direction parallel to the central axis of a connection portion 111a is referred to as an "axial direction AD1" (for example, FIG. 4). Further, a direction orthogonal to the central axis is referred to as a "radial direction RD1". The "radial direction RD1" may be any direction as long as the direction is a direction orthogonal to the central axis AX1, and is not particularly limited.

A direction parallel to the central axis of the inflow path tube 210 is referred to as an "axial direction AD2" (for example, FIG. 4). Further, a direction orthogonal to the central axis is referred to as a "radial direction RD2". The "radial direction RD2" may be any direction as long as the direction is a direction orthogonal to the central axis, and is not particularly limited.

Further, a direction parallel to the center axis of a band portion 310 of a clamp portion 300 is described as an "axial direction AD3" (for example, FIG. 4). Further, a direction orthogonal to the central axis is referred to as a "radial direction RD3". The "radial direction RD3" may be any direction as long as the direction is a direction orthogonal to the central axis, and is not particularly limited.

Note that in the present description, a "parallel direction" includes a substantially parallel direction, and an "orthogonal direction" includes a substantially orthogonal direction. Furthermore, in the present description, an "annular shape", a "cylindrical shape", a "tubular shape", a "circular shape", and a "wave shape" do not represent shapes in a strict sense.

FIG. 1 is a schematic diagram illustrating a configuration of a cooling system 100 according to the present example embodiment. As illustrated in FIG. 1, the cooling system 100 cools at least one heat source 5 installed in a space A01. Specifically, the cooling system 100 includes a CDU 1, a distribution manifold 2, a collection manifold 3, at least one cold plate 4, a cooling device 6, and flow paths 7 and 8. The CDU 1 is an example of a "medium circulation device".

When the cooling system 100 includes one cold plate 4, the cooling system 100 may not include the distribution manifold 2 and the collection manifold 3.

The CDU 1, the distribution manifold 2, the collection manifold 3, and a plurality of the cold plates 4 are installed in the space A01. The space A01 is, for example, a server room.

The space A01 is provided with a rack 9. A plurality of the heat sources 5 are accommodated in the rack 9. The plurality of heat sources 5 are accommodated in the rack 9 so as to be aligned in a specific direction. The specific direction is, for example, the Z direction or the Y direction.

Each heat source 5 is typically an electronic component or electronic equipment. The electronic component is a component constituting electronic equipment, and includes, for example, a central processing unit (so-called CPU), an electrolytic capacitor, a power semiconductor module, or a printed circuit board. The electronic component operates by power supply and generates heat. The electronic equipment is a rack mounted server or a blade server. The electronic equipment may also be a projector, a personal computer, or a display.

The CDU 1, the distribution manifold 2, the collection manifold 3, and the plurality of cold plates 4 are installed in the rack 9 together with the plurality of heat sources 5. A plurality of racks 9 may be provided in the space A01.

The CDU 1 is accommodated in, for example, the rack 9 at the time of use. However, the present disclosure is not limited to this, and the CDU 1 may be installed outside the rack 9 at the time of use. Specifically, the CDU 1 includes a housing 15, a pump (not shown), and a heat exchanger (not shown). The pump pumps the secondary refrigerant into the housing 15. The heat exchanger exchanges heat between the primary refrigerant and the secondary refrigerant.

The CDU 1 includes a secondary inflow port 11, a secondary outflow port 12, a primary inflow port 13, and a primary outflow port 14. A high-temperature secondary refrigerant flows into the secondary inflow port 11 from the collection manifold 3. A low-temperature primary refrigerant flows into the primary inflow port 13 through the flow path 7. The CDU 1 performs heat exchange between the secondary refrigerant (high temperature) flowing into the CDU 1 from the secondary inflow port 11 and the primary refrigerant (low temperature) flowing into the CDU 1 from the primary inflow port 13. As a result, in the CDU 1, the thermal energy of the secondary refrigerant moves to the primary refrigerant. That is, the temperature of the secondary refrigerant decreases as compared with when the secondary refrigerant flows into the CDU 1 by heat exchange. The CDU 1 pumps the secondary refrigerant having a low temperature from the secondary outflow port 12 toward the distribution manifold 2. The primary refrigerant having a high temperature is sent out from the primary outflow port 14 to the flow path 8.

The secondary refrigerant is, for example, a coolant. Examples of the coolant include antifreeze liquid and pure water. A typical example of antifreeze liquid is an ethylene glycol aqueous solution or a propylene glycol aqueous solution. The primary refrigerant is a refrigerant of the same type as or different type from the secondary refrigerant. At least one of the primary refrigerant and the secondary refrigerant may be a gas refrigerant.

The distribution manifold 2 includes a common flow path 21 and a plurality of individual flow paths 22. FIG. 1 shows only three individual flow paths 22 for the purpose of easy understanding. The secondary refrigerant can flow through each of the common flow path 21 and the plurality of individual flow paths 22. The other end of the common flow path 21 is connected to the secondary outflow port 12 of the CDU 1, and is used as an inflow port of the secondary refrigerant in the distribution manifold 2. One end of each of the plurality of individual flow paths 22 is connected to the common flow path 21 so that the secondary refrigerant can flow. The other end of each of the plurality of individual flow paths 22 is used as an outflow port for the secondary refrigerant in the distribution manifold 2, and is individually connected to the inflow port 41 of the cold plate 4.

Each cold plate 4 is in thermal contact with at least one heat source 5. The secondary refrigerant (low temperature) flows inside each cold plate 4. In detail, each cold plate 4 is arranged in direct thermal contact with the heat source 5. Each cold plate 4 may be arranged in thermal contact with the heat source 5 via a thermally conductive sheet (not shown), for example. That is, the term "thermal contact" includes the meaning of "direct thermal contact" and the meaning of "indirect thermal contact".

Each cold plate 4 has the inflow port 41, an outflow port 42, and an internal flow path 43 for the secondary refrigerant. The internal flow path 43 connects the inflow port 41 and the outflow port 42 such that the secondary refrigerant can flow therethrough. The secondary refrigerant (low temperature) flows into the inflow port 41 from the individual flow path 22 connected to the inflow port 41. The secondary refrigerant flows through the internal flow path 43 toward the outflow port 42. Therefore, the heat energy generated at the heat source 5 moves to the secondary refrigerant flowing through the internal flow path 43 of the cold plate 4 in thermal contact with the heat source 5. As a result, the heat source 5 is cooled, and the temperature of the secondary refrigerant rises. The secondary refrigerant (high temperature) flows out of the outflow port 42 to the individual flow path 31 of the collection manifold 3.

The collection manifold 3 has a plurality of the individual flow paths 31 and a common flow path 32. In FIG. 1, three individual flow paths 31 are illustrated for the purpose of easy understanding. The secondary refrigerant can flow through each of the plurality of individual flow paths 31 and the common flow path 32. The other end of the common flow path 32 is used as an outflow port of the secondary refrigerant in the collection manifold 3, and is connected to the secondary inflow port 11 of the CDU 1. One end of each of the individual flow paths 31 is connected to the common flow path 32 so that the secondary refrigerant can flow therethrough. The other end of each of the individual flow paths 31 is individually connected to the outflow port 42 of the cold plate 4 as an inflow port of the secondary refrigerant in the collection manifold 3. Therefore, the secondary refrigerant circulates through the CDU 1, the distribution manifold 2, the cold plate 4, and the collection manifold 3 in this order.

The cooling device 6 is installed outside the space A01, for example. Note that the cooling device 6 may be installed either indoors or outdoors. The cooling device 6 is, for example, a chiller or a cooling tower. The cooling device 6 includes an inflow port 61, an outflow port 62, and an internal flow path 63 for the primary refrigerant, a cooling unit 64, and a pump 65. The internal flow path 63 connects the inflow port 61 and the outflow port 62 so that the primary refrigerant can flow therethrough. The cooling unit 64 and the pump 65 are located to be connected to the internal flow path 63.

The primary refrigerant flowing into the inflow port 61 flows into the cooling unit 64 through the flow path. The cooling unit 64 cools the primary refrigerant flowing into the cooling unit 64. The cooling system in the cooling unit 64 may be either an air cooling system or a water cooling system. The primary refrigerant flowing out of the cooling unit 64 flows into the pump 65 through the flow path. The pump 65 pumps, toward the outflow port 62, the primary refrigerant flowing into the pump 65. In FIG. 1, the pump 65 is positioned between the cooling unit 64 and the outflow port 62 in the flow path of the primary refrigerant. However, the present disclosure is not limited to this, and the pump 65 may be positioned between the inflow port 61 and the cooling unit 64 in the flow path of the primary refrigerant.

Figure 2:
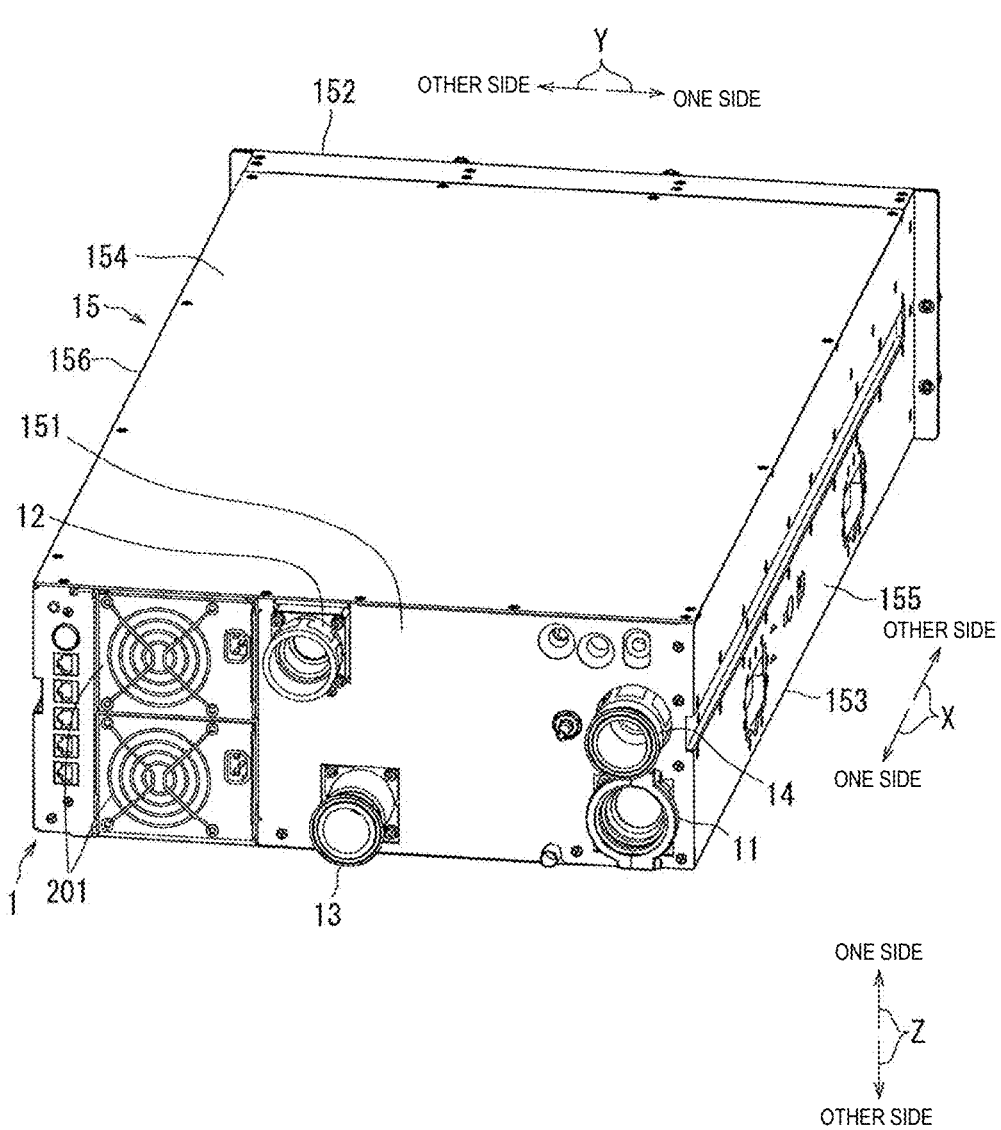
FIG. 2 is an external perspective view of a CDU illustrated in FIG. 1.

FIG. 2 is an external perspective view of the CDU 1 shown in FIG. 1.

As illustrated in FIG. 2, the outer shape of the housing 15 is, for example, a substantially rectangular parallelepiped shape, and is relatively thin in the Z direction and relatively long in the X direction. The housing 15 includes panels 151 to 156. The panels 151 to 156 define the outer shape of the housing 15. The panels 151 to 156 partition the internal space of the housing 15 from the outside.

The panels 151 and 152 are separated from each other in the X direction. In the present example embodiment, the panel 151 is positioned on one side in the X direction with respect to the panel 152. Each of the panels 151 and 152 extends in both the Z direction and the Y direction.

The panels 153 and 154 are separated from each other in the Z direction. In the present example embodiment, the panel 154 is positioned on one side in the Z direction with respect to the panel 153. Each of the panels 153 and 154 extends in both the X direction and the Y direction.

The panels 155 and 156 are separated from each other in the Y direction. In the present example embodiment, the panel 155 is positioned on one side in the Y direction with respect to the panel 156. Each of the panels 155 and 156 extends in both the Z direction and the X direction. In the housing 15, the panels 151 to 156 may be separately detachable or may be integrally molded.

The CDU 1 further includes a power supply unit 201. In the present example embodiment, the number of power supply units 201 is two. The number of power supply units 201 may be at least one. The two power supply units 201 are preferably manufactured in accordance with the same specifications.

Each power supply unit 201 is a power supply circuit or the like. Each power supply unit 201 generates a first DC voltage from an AC voltage supplied from a commercial power supply, for example. On the other hand, each power supply unit 201 generates a second DC voltage lower than the first DC voltage from the AC voltage. The first DC voltage is supplied to the pump (not illustrated), for example. The second DC voltage is supplied to, for example, a control unit (not illustrated).

In the present example embodiment, the two power supply units 201 are stacked in the Z direction in the housing 15. A partition plate may be located between the two power supply units 201. The two power supply units 201 are positioned between the panels 153 and 154 in the Z direction. The two power supply units 201 are exposed from the panel 151. The two power supply units 201 are positioned closer to the panel 156 than the panel 155 in the Y direction. In detail, the two power supply units 201 are close to the panel 156 via a slight gap.

The housing 15 has, as four ports on the panel 151, the secondary inflow port 11, the secondary outflow port 12, the primary inflow port 13, and the primary outflow port 14. Each of the four ports is positioned to the right relative to the power supply unit 201 toward the panel 151. Each of the four ports protrudes from the panel 151 to one side in the X direction. The secondary inflow port 11 is positioned at the lower right corner of the panel 151 as viewed toward the panel 151, for example. In other words, the secondary inflow port 11 is positioned near the other end in the Z direction and near one end in the Y direction of the panel 151.

The primary inflow port 13 is positioned on the left of the secondary inflow port 11 as viewed toward the panel 151, for example. In other words, the primary inflow port 13 is positioned on the other side in the Y direction with respect to the secondary inflow port 11.

The secondary outflow port 12 is positioned on the diagonally upper left of the primary inflow port 13 as viewed toward the panel 151, for example. In other words, the secondary outflow port 12 is positioned on the other side in the Y direction and on one side in the Z direction with respect to the primary inflow port 13.

The primary outflow port 14 is positioned above the secondary inflow port 11 as viewed toward the panel 151, for example. In other words, the primary outflow port 14 is positioned on one side in the Z direction with respect to the secondary inflow port 11.

Figure 3:
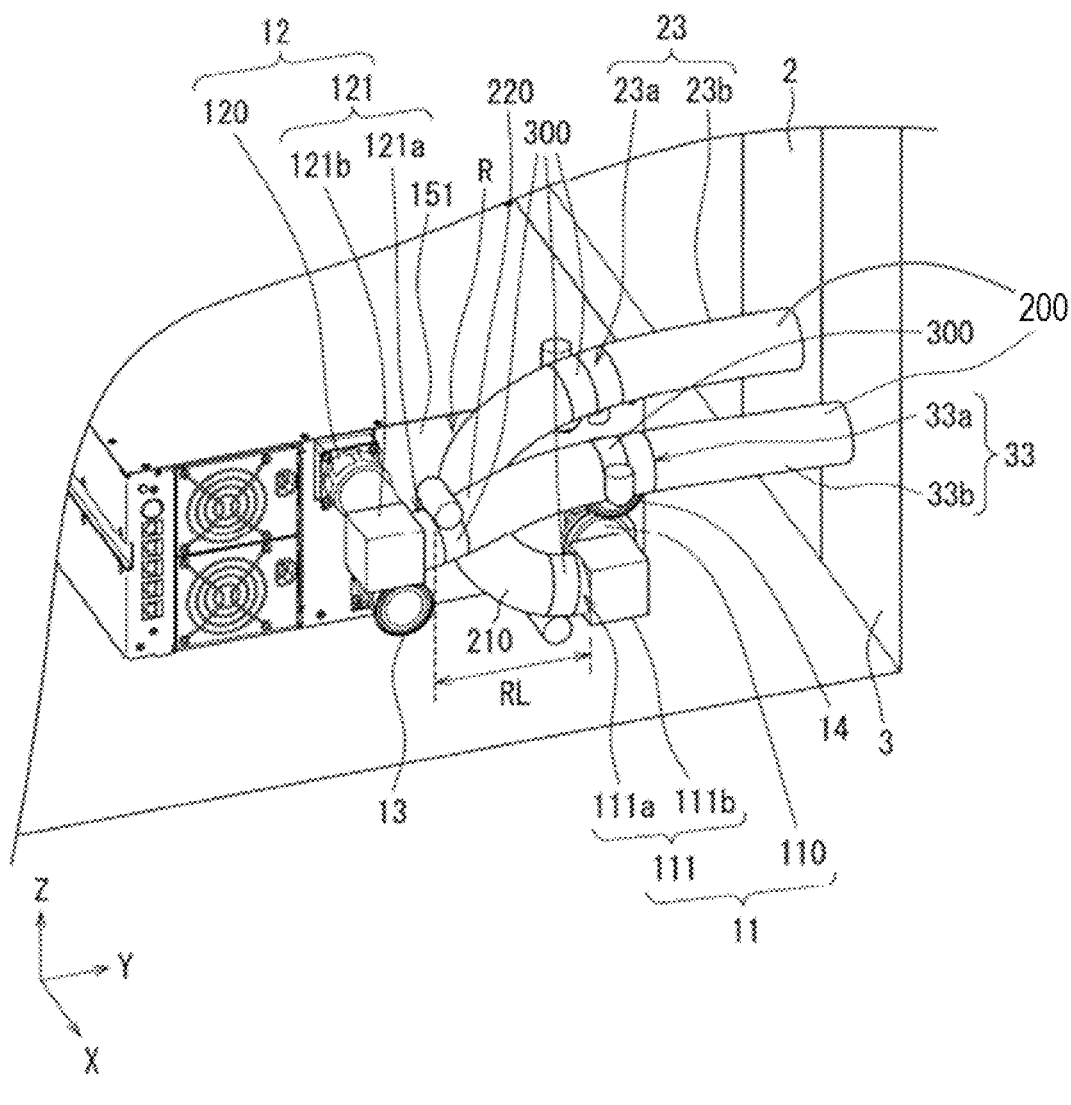
FIG. 3 is an external perspective view of the CDU, a collection manifold, and a distribution manifold illustrated in FIG. 1.

Next, the flow path tube 200 and the clamp portion 300 will be described with reference to FIGS. 3 and 4. FIG. 3 is an external perspective view of the CDU 1, the collection manifold 3, and the distribution manifold 2 illustrated in FIG. 1. FIG. 4 is a cross-sectional view of the inflow path tube 210 and the clamp portion 300.

As shown in FIGS. 3 and 4, the cooling system 100 further includes the flow path tube 200 and four clamp portions 300. The flow path tube 200 and the clamp portion 300 are parts of the "flow path structure". In the example embodiment, the number of clamp portions 300 is four. The number of clamp portions 300 may be at least one.

The secondary inflow port 11 includes an annular body 110 and a port member 111. The annular body 110 protrudes from the panel 151 to one side in the X direction. The port member 111 is located on one side in the X direction of the annular body 110. The port member 111 includes a block member 111b and a connection portion 111a. The connection portion 111a is a part of the "flow path structure". The shape of the block member 111b is a substantially rectangular parallelepiped shape. The surface on the other side in the X direction of the block member 111b is connected to one side in the X direction of the annular body 110.

The connection portion 111a is located on the surface on the other side in the Y direction of the block member 111b. The connection portion 111a protrudes to the other side in the Y direction. The connection portion 111a internally includes a connection portion space 113 through which the secondary refrigerant flows. Specifically, the connection portion 111a has a substantially annular shape. A corrugated protrusion is preferably located on the outer peripheral surface of the connection portion 111a. In addition, the material of the connection portion 111a may be a composite material, and is preferably metal. Inside the block member 111b, an internal flow path 112 that connects the annular body 110 and the connection portion 111a so that the secondary refrigerant can flow is located.

The secondary outflow port 12 includes an annular body 120 and a port member 121. The annular body 120 protrudes from the panel 151 to one side in the X direction. The length of the annular body 120 in the X direction is longer than the length of the annular body 110 in the X direction. The port member 121 is located on one side in the X direction of the annular body 120. The port member 121 includes a block member 121b and a connection portion 121a. The shape of the block member 121b is a substantially rectangular parallelepiped shape. The surface on the other side in the X direction of the block member 121b is connected to one side in the X direction of the annular body 120.

The connection portion 121a is located on a surface on one side in the Y direction of the block member 121b. The connection portion 121a protrudes to one side in the Y direction. The connection portion 121a internally includes a connection portion space through which the primary refrigerant flows. Specifically, the connection portion 121a has a substantially annular shape. A corrugated protrusion is preferably located on the outer peripheral surface of the connection portion 121a. In addition, the material of the connection portion 121a may be a composite material, and is preferably metal. Inside the block member 121b, an internal flow path that connects the annular body 120 and the connection portion 121a so that the primary refrigerant can flow is located.

The distribution manifold 2 has a common flow path port 23 as a port. The common flow path port 23 is located on one side in the Z direction and one side in the Y direction with respect to the secondary inflow port 11.

The common flow path port 23 includes an annular body 23b and a connection portion 23a. The connection portion 23a is a part of the "flow path structure". The connection portion 23a is different from the connection portion 111a. The annular body 23b protrudes to the other side in the Y direction. The connection portion 23a is located on the other side in the Y direction of the annular body 23b. The connection portion 23a protrudes to the other side in the Y direction. The connection portion 23a internally includes a connection portion space through which the secondary refrigerant flows. Specifically, the connection portion 23a has a substantially annular shape. A corrugated protrusion is preferably located on the outer peripheral surface of the connection portion 23a. In addition, the material of the connection portion 23a may be a composite material, and is preferably metal.

The collection manifold 3 further includes a common flow path port 33 as a port. The common flow path port 33 is located on one side in the X direction with reference to the common flow path port 23.

The common flow path port 33 includes an annular body 33b and a connection portion 33a. The annular body 33b protrudes to the other side in the Y direction. The connection portion 33a is located on the other side in the Y direction of the annular body 33b. The connection portion 33a protrudes to the other side in the Y direction. The connection portion 33a internally includes a connection portion space through which the secondary refrigerant flows. Specifically, the connection portion 33a has a substantially annular shape. A corrugated protrusion is preferably located on the outer peripheral surface of the connection portion 33a. In addition, the material of the connection portion 33a may be a composite material, and is preferably metal.

The flow path tube 200 includes an inflow path tube 210. The secondary refrigerant flows into the CDU 1 from the inflow path tube 210.

The inflow path tube 210 internally includes a flow path tube space 211 through which the secondary refrigerant flows. Specifically, the inflow path tube 210 has a substantially annular shape. The inner diameter of the inflow path tube 210 is preferably larger than the outer diameter of the connection portion 111a. In addition, the inflow path tube 210 has elasticity and can be curved. Specifically, the material of the inflow path tube 210 may be a composite material, and is preferably a synthetic resin. At this time, the thermal expansion coefficient of the inflow path tube 210 is different from the thermal expansion coefficient of the connection portion 111a. Therefore, when the heat moves between the secondary refrigerant or the like and the inflow path tube 210 and the connection portion 111a, a gap may be generated between the inflow path tube 210 and the connection portion 111a. Specifically, the thermal expansion coefficient of the inflow path tube 210 is larger than the thermal expansion coefficient of the connection portion 111a. Therefore, when the inflow path tube 210 and the connection portion 111a are heated by the secondary refrigerant or the like, a gap may be generated between the inner peripheral surface of the inflow path tube 210 and the outer peripheral surface of the connection portion 111a.

In the flow path tube space 211, at least a part of the connection portion 111a is located. Specifically, the connection portion 111a is inserted into the flow path tube space 211 at one end of the inflow path tube 210. In other words, the inflow path tube 210 includes a first portion OA in which one end side of the inflow path tube 210 and the connection portion 111a overlap. The axial direction AD1 of the connection portion 111a and the axial direction AD2 of the inflow path tube 210 preferably coincide with each other.

The connection portion 23a is inserted into the flow path tube space 211 at the other end of the inflow path tube 210. In other words, the inflow path tube 210 includes a second portion in which the other end side of the inflow path tube 210 and the connection portion 23a overlap. The axial direction of the connection portion 23a and the axial direction AD2 of the inflow path tube 210 preferably coincide with each other.

The inflow path tube 210 further includes a folded portion R that connects the first portion OA and the second portion. Specifically, one end portion of the folded portion R is connected to the first portion OA, and the other end portion of the folded portion R is connected to the second portion. Specifically, the folded portion R has a substantially U-shape. Accordingly, the folded portion R is located on the other side in the Y direction of the connection portion 111a and the other side in the Y direction of the connection portion 23a.

A length RL in the Y direction from one end of the inflow path tube 210 to the end on the other side in the Y direction of the folded portion R is shorter than twice a length OAL in the Y direction of the first portion OA or the second portion. In other words, the inflow path tube 210 is bent in a narrow range.

Figure 5:
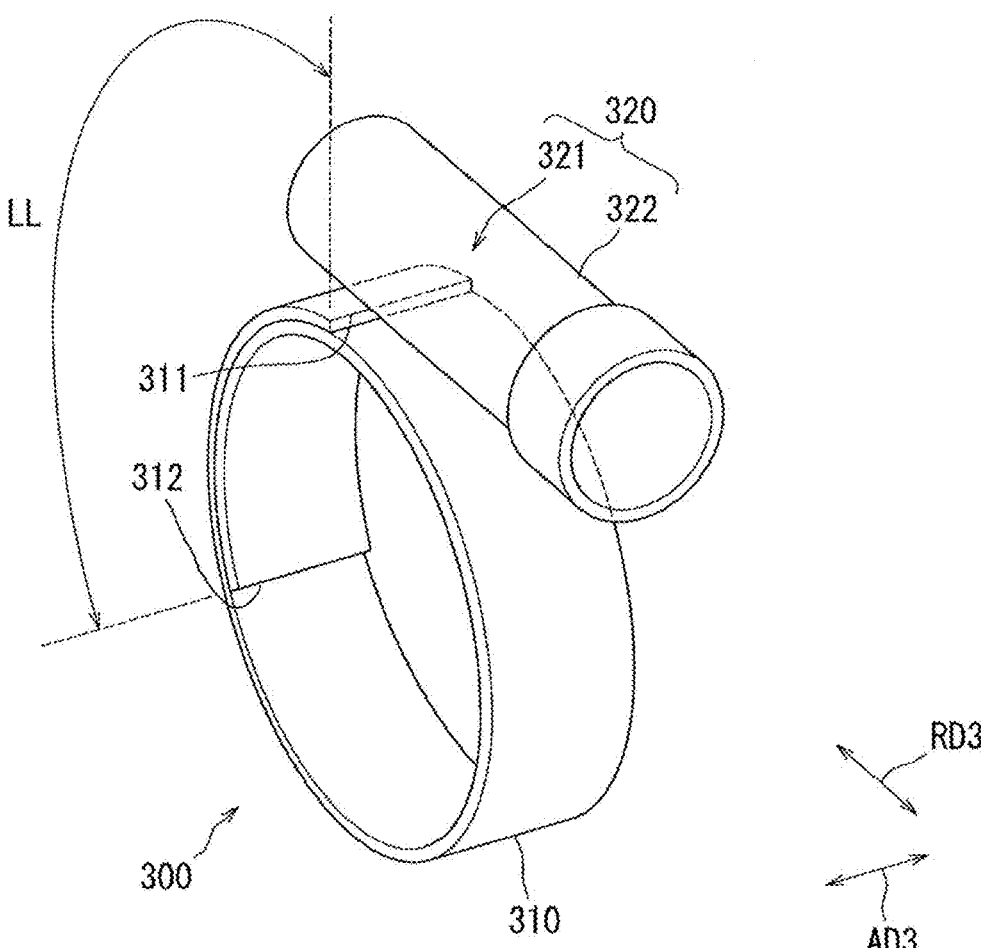
FIG. 5 is an external perspective view of an example of a clamp portion according to an example embodiment of the present disclosure.

Next, the clamp portion 300 will be described with reference to FIGS. 3 to 5. FIG. 5 is an external perspective view of an example of the clamp portion 300. As illustrated in FIGS. 3 to 5, each of the four clamp portions 300 is located on the outer peripheral surface of the flow path tube 200.

Specifically, one clamp portion 300 out of the four clamp portions 300 is located on the outer peripheral surface of one end portion of the inflow path tube 210. Further, one clamp portion 300 out of the four clamp portions 300 is located on the outer peripheral surface of the other end portion of the inflow path tube 210.

The clamp portion 300 includes a band portion 310 and an acting portion 320.

The band portion 310 surrounds the outer peripheral surface of the inflow path tube 210 at a position where the inflow path tube 210 and the connection portion 111*a* overlap each other in the radial directions RD1 and RD2. Specifically, at least a portion of the first portion OA surrounds the outer peripheral surface of the inflow path tube 210. More specifically, in the radial direction RD3, the inner peripheral surface of the band portion 310 faces a plurality of protrusions provided on the outer peripheral surface of the connection portion 111*a*. Further, in the radial direction RD3, the inner peripheral surface of the band portion 310 faces the protrusion on the most root side (block member 111*b* side) among the plurality of protrusions provided on the outer peripheral surface of the connection portion 111*a*. Furthermore, a space AA is provided between the outer peripheral surface of the root of the connection portion 111*a* and the inner peripheral surface of the tip portion of the inflow path tube 210. In other words, the band portion 310 does not surround the outer peripheral surface of the tip portion of the inflow path tube 210 and the outer peripheral surface of the root of the connection portion 111*a*.

Specifically, the band portion 310 has an annular shape in which a part of the arc overlaps. In other words, a part of the band portion 310 is doubled. Specifically, one end portion 311 of the band portion 310 and the other end portion 312 of the band portion 310 are separated by an interval LL. One end portion of the inflow path tube 210 is inserted into the space of the band portion 310. The band portion 310 has elasticity. Specifically, the band portion 310 is a thin metal. Therefore, the interval LL between the one end portion 311 and the other end portion 312 can be changed. In other words, the inner diameter of the band portion 310 can be changed.

The acting portion 320 changes the size of the inner diameter of the band portion 310 in accordance with a change in the size of at least one of the outer diameter of the inflow path tube 210, the inner diameter of the inflow path tube 210, and the outer diameter of the connection portion 111*a*. Specifically, the acting portion 320 preferably changes the size of the inner diameter of the band portion 310 in accordance with the outer diameter of the connection portion 111*a*. Specifically, when the inner diameter of the inflow path tube 210 becomes larger than the outer diameter of the connection portion 111*a* due to heat or the like, the acting portion 320 suppresses a decrease in the interval LL between the one end portion 311 and the other end portion 312. As a result, the inner diameter of the band portion 310 is prevented from increasing. Therefore, the inner peripheral surface of the inflow path tube 210 is pressed against the outer peripheral surface of the connection portion 111*a*. When the outer diameter of the connection portion 111*a* becomes smaller than the inner diameter of the inflow path tube 210 due to heat or the like, the acting portion 320 increases the interval LL between the one end portion 311 and the other end portion 312. As a result, the inner diameter of the band portion 310 decreases. Therefore, the inner peripheral surface of the inflow path tube 210 is pressed against the outer peripheral surface of the connection portion 111*a*.

As described above, according to the example embodiment, even when the size of the inflow path tube 210 and the size of the connection portion 111*a* change differently due to heat, the secondary refrigerant can be suppressed from leaking from between the inflow path tube 210 and the connection portion 111*a*. In addition, since the inner peripheral surface of the band portion 310 faces the plurality of protrusions provided on the outer peripheral surface of the connection portion 111*a*, it is possible to further suppress the secondary refrigerant from leaking from between the inflow path tube 210 and the connection portion 111*a*. In addition, since the inner peripheral surface of the band portion 310 faces the protrusion on the most root side (block member 111*b* side) among the plurality of protrusions provided on the outer peripheral surface of the connection portion 111*a*, it is possible to further suppress the secondary refrigerant from leaking from between the inflow path tube 210 and the connection portion 111*a*. Since the space AA is provided between the outer peripheral surface of the root of the connection portion 111*a* and the inner peripheral surface of the tip portion of the inflow path tube 210, it is possible to further suppress the secondary refrigerant from leaking from between the inflow path tube 210 and the connection portion 111*a*.

In addition, since the inflow path tube 210 can be bent in a narrow range, it is possible to suppress deterioration of workability due to overlapping with another member (power supply unit) located on the same surface of the housing 15.

Since the inflow path tube 210 is made of synthetic resin, the inflow path tube 210 can be routed better than a case where the inflow path tube 210 is made of metal.

Since the material of the connection portion 111*a* is metal, durability can be enhanced as compared with the case where the material of the connection portion 111*a* is synthetic resin.

Specifically, the acting portion 320 includes a spring portion 321 and a casing 322. Specifically, the casing 322 has a cylindrical shape. The casing 322 is located on the outer peripheral surface of the band portion 310. Specifically, the casing 322 is connected to the one end portion 311 and the other end portion 312. The axial direction of the casing 322 is along the radial direction RD3 of the band portion 310.

The spring portion 321 is located inside the casing 322. Specifically, the spring portion 321 includes a spring. The spring acts on the one end portion 311 and one region of the outer peripheral surface of the band portion 310 so as to increase the interval LL between the one end portion 311 and the other end portion 312. In addition, the spring suppresses shortening of the interval LL between the one end portion 311 and the other end portion 312 when a force that shortens the interval LL between the one end portion 311 and the other end portion 312 is applied.

As described above, according to the present example embodiment, by continuously applying tension to the spring portion 321, the inner diameter of the spring portion 321 can follow each time the size of the inflow path tube 210 and the size of the connection portion 111*a* change differently.

Next, the outflow path tube 220 will be described with reference to FIGS. 3 to 5. The flow path tube 200 further includes the outflow path tube 220. The secondary refrigerant flows out of the CDU 1 into the outflow path tube 220.

The outflow path tube 220 internally includes a flow path tube space through which the secondary refrigerant flows. Specifically, the outflow path tube 220 has a substantially annular shape. The inner diameter of the outflow path tube 220 is preferably larger than the outer diameter of the connection portion 121*a*. In addition, the outflow path tube 220 has elasticity and can be curved. Specifically, the material of the outflow path tube 220 may be a composite material, and is preferably synthetic resin. At this time, the thermal expansion coefficient of the outflow path tube 220 is different from the thermal expansion coefficient of the connection portion 121*a*. Therefore, when the heat moves between the secondary refrigerant or the like and the outflow path tube 220 and the connection portion 121*a*, a gap may be generated between the outflow path tube 220 and the connection portion 121*a*. Specifically, the thermal expansion coefficient of the outflow path tube 220 is larger than the thermal expansion coefficient of the connection portion 121*a*. Therefore, when the outflow path tube 220 and the connection portion 121*a* are heated by the secondary refrigerant or the like, a gap may be generated between the inner peripheral surface of the outflow path tube 220 and the outer peripheral surface of the connection portion 121*a*.

The connection portion 121*a* is inserted into the flow path tube space at one end of the outflow path tube 220. Further, the connection portion 33*a* is inserted into the flow path tube space at the other end of the outflow path tube 220. In the present example embodiment, the length of the outflow path tube 220 is shorter than the length of the inflow path tube 210. The outflow path tube 220 does not include a folded portion. In other words, the secondary refrigerant flows through the flow path tube space of the outflow path tube 220 along one direction.

One clamp portion 300 out of the four clamp portions 300 is located on the outer peripheral surface of one end portion of the outflow path tube 220. Further, one clamp portion 300 out of the four clamp portions 300 is located on the outer peripheral surface of the other end portion of the outflow path tube 220.

At least a part of the inflow path tube 210 and at least a part of the outflow path tube 220 overlap each other in the X direction. Specifically, when the inflow path tube 210 attempts to move along the X direction, the inflow path tube 210 comes into contact with the outflow path tube 220. As a result, movement of the inflow path tube 210 in the X direction and movement of the outflow path tube 220 in the X direction can be suppressed.

Specifically, the outflow path tube 220 is located on one side in the X direction with respect to the inflow path tube 210. Specifically, when the inflow path tube 210 attempts to move to one side in the X direction, the inflow path tube 210 comes into contact with the outflow path tube 220. As a result, the inflow path tube 210 including the folded portion R can be suppressed from moving toward one side in the X direction. In addition, the inflow path tube 210 has a length longer than the length of the outflow path tube 220, and further includes the folded portion R. Therefore, the inflow path tube is easy to move, but movement to one side in the X direction can be suppressed.

The spring portion 321 of the clamp portion 300 located in the inflow path tube 210 is located at a position spaced away from the outflow path tube 220. Specifically, the spring portion 321 of the clamp portion 300 located on the outer peripheral surface of one end portion of the inflow path tube 210 is located on the other side in the Z direction with respect to the inflow path tube 210. The spring portion 321 of the clamp portion 300 located on the outer peripheral surface of the other end portion of the inflow path tube 210 is located on the other side in the X direction with respect to the inflow path tube 210. As a result, damage due to contact between the spring portion 321 and the outflow path tube 220 can be suppressed.

The spring portion 321 of the clamp portion 300 located in the outflow path tube 220 is located at a position spaced away from the inflow path tube 210. Specifically, the spring portion 321 of the clamp portion 300 located on the outer peripheral surface of one end portion of the outflow path tube 220 is located on one side in the Z direction with respect to the outflow path tube 220. Further, the spring portion 321 of the clamp portion 300 located on the outer peripheral surface of the other end portion of the outflow path tube 220 is located on one side in the X direction with respect to the outflow path tube 220. As a result, damage due to contact between the spring portion 321 and the inflow path tube 210 can be suppressed.

The drawings schematically show each component mainly in order to facilitate understanding of the present disclosure, and the thickness, length, number, interval, and the like of each component that is shown may be different from the actual ones for convenience of the drawings. The configuration of each component shown in the above example embodiment is an example and is not particularly limited, and it goes without saying that various modifications can be made without substantially departing from the effects of the present disclosure.

Figure 6:
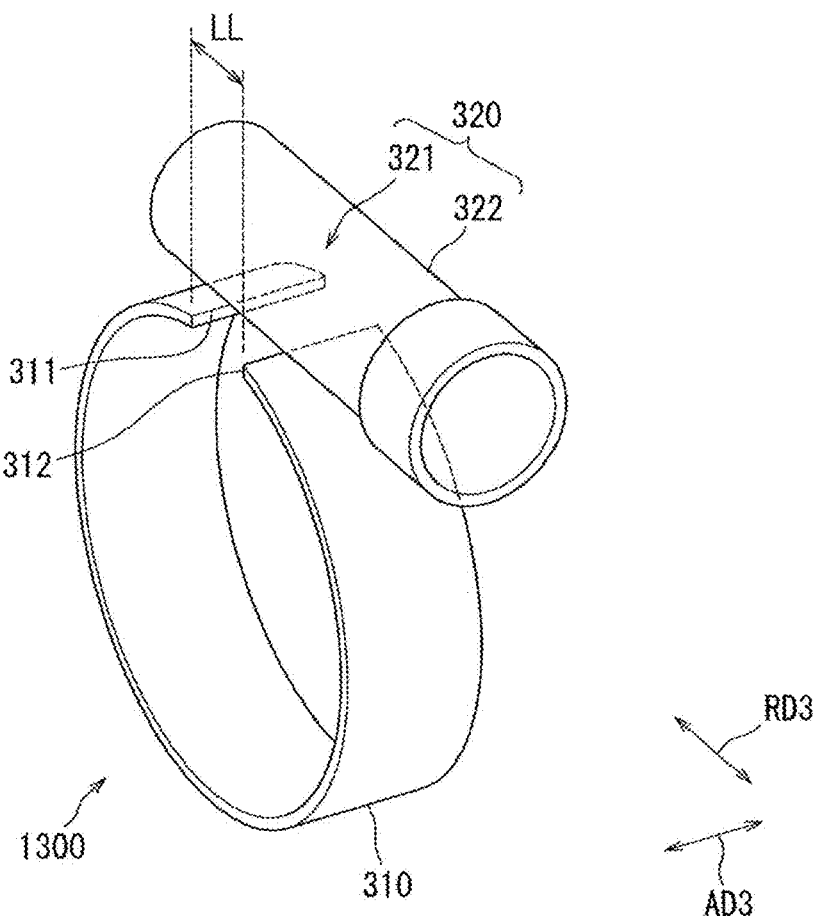
FIG. 6 is an external perspective view of another example of a clamp portion according to an example embodiment of the present disclosure.

Note that the shape of the band portion 310 according to the present example embodiment is an annular shape in which a part of the arc overlaps, but is not limited thereto. The shape of the band portion 310 may be an annular shape in which a part is missing. FIG. 6 is an external perspective view of another example of a clamp portion 1300. The one end portion 311 of the band portion 310 and the other end portion 312 of the band portion 310 face each other. One end portion of the inflow path tube 210 is inserted into the space of the band portion 310. The band portion 310 has elasticity. Specifically, the band portion 310 is a thin metal. Therefore, the interval LL between the one end portion 311 and the other end portion 312 can be changed. In other words, the inner diameter of the band portion 310 can be changed.

The present technologies can also adopt the following configurations.

(1) A flow path structure to be used in a medium circulation device in which a medium circulates, the flow path structure including a flow path tube including a flow path tube space through which the medium flows, a connection portion including a connection portion space in which the medium flows, at least a portion of the connection portion being located in the flow path tube space, and a clamp portion located on an outer peripheral surface of the flow path tube; in which a thermal expansion coefficient of the flow path tube is different from a thermal expansion coefficient of the connection portion, and the clamp portion includes a band portion surrounding an outer peripheral surface of the flow path tube at a position where the flow path tube and the connection portion overlap each other in a radial direction, and an acting portion that changes size of an inner diameter of the band portion in accordance with a change in size of at least one of an outer diameter of the flow path tube, an inner diameter of the flow path tube, and an outer diameter of the connection portion.

(2) The flow path structure according to (1), in which the flow path tube includes an inflow path tube through which the medium flows into the medium circulation device, and an outflow path tube through which the medium flows out of the medium circulation device, at least a portion of the inflow path tube and at least a portion of the outflow path tube overlap each other in first directions, and one of the first directions indicates a direction away from the medium circulation device.

(3) The flow path structure according to (2), in which the connection portion includes a first connection portion, and a second connection portion different from the first connection portion, one of the inflow path tube and the outflow path tube further includes a first portion in which one end side of the flow path tube overlaps the first connection portion, a second portion in which another end side of the flow path tube overlaps the second connection portion, and a folded portion connecting the first portion and the second portion, the folded portion is located on another side in a second direction of the first connection portion and on another side in the second direction of the second connection portion, another of the inflow path tube and the outflow path tube is located on a side of the one of the first directions with respect to the one of the inflow path tube and the outflow path tube, and the second direction and the first directions intersect each other.

(4) The flow path structure according to (3), in which a length in the second direction from one end of one of the inflow path tube and the outflow path tube to an end of the folded portion on the another side in the second direction is shorter than twice a length of the first portion or the second portion in the second direction.

(5) The flow path structure according to any one of (1) to (4), in which a material of the flow path tube is synthetic resin.

(6) The flow path structure according to any one of (1) to (5), in which a material of the connection portion is metal.

(7) The flow path structure according to (2), in which the acting portion includes a spring portion.

(8) The flow path structure according to (7), in which the spring portion of the clamp portion located on one of the inflow path tube and the outflow path tube is located at a position spaced away from another of the inflow path tube and the outflow path tube.

The flow paths structures according to example embodiments of the present disclosure have industrial applicability.

Features of the above-described example embodiments and the modifications thereof may be combined appropriately as long as no conflict arises.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A flow path structure for a medium circulation device in which a medium circulates, the flow path structure comprising:

a flow path tube including a flow path tube space through which the medium flows;

at least one connection portion including a connection portion space in which the medium flows, at least a portion of the at least one connection portion being located in the flow path tube space; and a clamp portion located on an outer peripheral surface of the flow path tube; wherein a thermal expansion coefficient of the flow path tube is different from a thermal expansion coefficient of the at least one connection portion;

the clamp portion includes:

a band portion surrounding the outer peripheral surface of the flow path tube at a position where the flow path tube and the at least one connection portion overlap each other in a radial direction; and an acting portion that changes size of an inner diameter of the band portion in accordance with a change in size of at least one of an outer diameter of the flow path tube, an inner diameter of the flow path tube, and an outer diameter of the at least one connection portion;

the flow path tube includes:

an inflow path tube through which the medium flows into the medium circulation device; and an outflow path tube through which the medium flows out of the medium circulation device;

at least a portion of the inflow path tube and at least a portion of the outflow path tube overlap each other when viewed along a first direction extending away from the medium circulation device;

the at least one connection portion includes:

a first connection portion; and a second connection portion different from the first connection portion;

the inflow path tube further includes a first portion in which one end side of the flow path tube overlaps the first connection portion, a second portion in which another end side of the flow path tube overlaps the second connection portion, and a folded portion connecting the first portion and the second portion;

the folded portion is located on a same side of both of the first connection portion and the second connection portion in a second direction which intersects the first direction; and the outflow path tube is located at a side of the inflow path tube in the first direction.

2. The flow path structure according to claim 1, wherein a length in the second direction from one end of one of the inflow path tube and the outflow path tube to an end of the folded portion on the another side in the second direction is shorter than twice a length of the first portion or the second portion in the second direction.

3. The flow path structure according to claim 1, wherein a material of the flow path tube is synthetic resin.

4. The flow path structure according to claim 1, wherein a material of the connection portion is metal.

5. The flow path structure according to claim 1, wherein the acting portion includes a spring portion.

6. The flow path structure according to claim 5, wherein the spring portion of the clamp portion located on one of the inflow path tube and the outflow path tube is located at a position spaced away from the other of the inflow path tube and the outflow path tube.

* * * * *